United States Patent [19]

Bergendahl et al.

[11] Patent Number: 5,196,722
[45] Date of Patent: Mar. 23, 1993

[54] SHADOW RAM CELL HAVING A SHALLOW TRENCH EEPROM

[75] Inventors: Albert S. Bergendahl, Underhill; Claude L. Bertin, South Burlington; John E. Cronin, Milton; Howard L. Kalter, Colchester; Donald M. Kenney, Shelburne; Chung H. Lam, Williston; Hsing-San Lee, Essex Junction, all of Vt.

[73] Assignee: International Business Machines Corporation, Armonk, N.Y.

[21] Appl. No.: 848,913

[22] Filed: Mar. 12, 1992

[51] Int. Cl.$^5$ .................. H01L 29/78; H01L 27/10; H01L 29/06
[52] U.S. Cl. .......................... 257/304; 257/320; 257/390; 257/622
[58] Field of Search .................. 357/23.5, 23.6, 55

[56] References Cited

U.S. PATENT DOCUMENTS

| | | | |
|---|---|---|---|
| 4,375,086 | 2/1983 | Van Velthoven | 357/23.5 |
| 4,471,471 | 9/1984 | DiMaria | 357/23.5 |
| 4,615,020 | 9/1986 | Rinerson et al. | 357/23.5 |
| 4,665,417 | 5/1987 | Lam | 357/23.5 |
| 4,774,556 | 9/1988 | Fujii et al. | 357/23.5 |
| 4,835,741 | 5/1989 | Baglee | 357/23.5 |
| 4,929,988 | 5/1990 | Yoshikawa | 357/23.5 |
| 4,962,322 | 10/1990 | Chapman | 357/23.5 |
| 4,990,979 | 2/1991 | Otto | 357/23.5 |
| 5,017,977 | 5/1991 | Richardson | 357/23.5 |
| 5,049,956 | 9/1991 | Yoshida et al. | 357/23.5 |
| 5,053,842 | 10/1991 | Kojima | 357/23.5 |
| 5,071,782 | 12/1991 | Morz | 357/23.5 |
| 5,078,498 | 1/1992 | Kadakia et al. | 357/23.5 |
| 5,146,426 | 9/1992 | Mukherjee et al. | 357/23.5 |

OTHER PUBLICATIONS

"A 4M Bit NVRAM Technology Using a Novel Stacked Capacitor On Selectively Self-Aligned Flotox Cell Structure" I.E.D.M. 90. 931-933 (1990).

Primary Examiner—Gene M. Munson
Attorney, Agent, or Firm—Heslin & Rothenberg

[57] ABSTRACT

A semiconductor device memory array formed on a semiconductor substrate comprising a multiplicity of field effect transistor DRAM devices disposed in array is disclosed. Each of the DRAM devices is paired with a non-volatile EEPROM cell and the EEPROM cells are disposed in a shallow trench in the semiconductor substrate running between the DRAM devices such that each DRAM-EEPROM pair shares a common drain diffusion. The EEPROM cells are arranged in the trench such that there are discontinuous laterally disposed floating gate polysilicon electrodes and continuous horizontally disposed program and recall gate polysilicon electrodes. The floating gate is separated from the program and recall gates by a silicon rich nitride. The array of the invention provides high density shadow RAMs. Also disclosed are methods for the fabrication of devices of the invention.

35 Claims, 7 Drawing Sheets

SHADOW RAM CELL HAVING A SHALLOW TRENCH EEPROM

TECHNICAL FIELD

The invention relates to a semiconductor device memory array having an array of DRAM devices paired with non-volatile EEPROM cells disposed in a shallow trench in a semiconductor substrate. Each DRAM/EEPROM pair shares a common diffusion. The invention provides a combination of DRAM read/write performance with EEPROM non-volatility. The data is transferred from DRAM to EEPROM when power is lost and is transferred back from EEPROM to DRAM when power is restored. The EEPROM storage eliminates the need for a battery backup.

BACKGROUND ART

A typical MOS dynamic memory cell (DRAM) consists of a single transistor and a capacitor. The state of the memory cell is a function of the charge stored on the capacitor which is shown as element 14 in FIG. 2 below. The single transistor and capacitor in a DRAM have several advantages with respect to static RAMs. Unfortunately the charge on the capacitor in the DRAM leaks and is lost within a short time. To prevent data from being lost, DRAMs are designed to be refreshed periodically. (DRAMs are referred to as volatile RAMs since information stored in the cells is lost when the power supply voltage applied to the memory is lost or turned off.) In instances where stored volatile information must be retained, an alternate power supply, such as a battery system, must be coupled to the memory for use in the event of failure of the main power supply.

By incorporating non-volatile devices with the memory cells, normally operating volatile cells can be made independent of a backup power supply. Non-volatile devices that could be used as backup memory are known in the art.

U.S. Pat. No. 4,990,979 (Otto) discloses an electrically erasable floating-gate memory cell (EEPROM) in which the Fowler-Nordheim tunnel effect is exploited for programming and erasing. The inversion created by a charged floating-gate electrode in the Otto device is horizontal but one edge of the floating gate polysilicon material extends into a trench to accommodate a larger electrode size with a lessened adverse effect on integration density. The control gate, source and drain are located horizontally in the cell.

U.S. Pat. No. 5,049,956 (Yoshida et al.) discloses an EPROM (electrically programmable read only memory) wherein each cell comprises an individual trench containing a control gate and a floating gate separated by a silicon oxide layer. The silicon oxide layer may be replaced with a mixture of silicon oxide and silicon nitride. The cell described is an EPROM and although the application states that the invention is applicable not only to an EPROM but also to an EEPROM (erasable electrically programmable read only memory) the technology to convert the EPROM to an EEPROM is not straightforward. In particular, a gate oxide which is deposited vertically in the trench would have to be properly contoured to create a tunnel oxide in one region. Alternatively, to function as an EEPROM the cell of Yoshida would require a very high voltage to be applied to the drain node of the silicon substrate. This would cause numerous difficulties, particularly if other functions such as the DRAM of the present invention had to be located nearby.

U.S. Pat. No. 5,053,842 (Kojima) discloses a non-volatile memory having a vertically oriented floating gate. The write and erase functions require high voltage and high current.

U.S. Pat. No. 5,017,977 (Richardson) discloses an EPROM array having floating gate field effect transistors formed on the sidewalls of trenches which are cut in a semiconducting substrate. Because the floating gates are charged by injecting hot electrons, high voltages and high currents are required for the write and erase cycles.

U.S. Pat. No. 4,929,988 (Yoshikawa) discloses a non-volatile memory device in which the transistor is formed vertically by forming a floating gate electrode and a control gate electrode on a sidewall of a groove formed in a semiconductor.

The combination of a DRAM and a non-volatile device is called a shadow RAM. Shadow RAMs are known.

U.S. Pat. No. 4,471,471 (DiMaria) discloses an array of field effect transistor memory cells each including a DRAM device comprising a floating gate portion and storage node and each including also a non-volatile unit comprising a double electron injector structure adjacent the floating gate portion but remote from the storage node. The floating gate and the electron injector structure are horizontally oriented and remote from the DRAM. These two features together result in non-volatile RAM devices that provide significantly fewer cells per unit area than those of the invention.

Yamauchi et al. [I.E.D.M. 90. 931-933 (1990)] describe a stacked capacitor DRAM in combination with a flotox EEPROM as a shadow RAM system. The combined cell is more than twice the size of a corresponding simple DRAM array. In addition, the shadow RAM requires an erase cycle before information can be written into the EEPROM. This limits the useful lifetime of the EEPROM because every EEPROM must be cycled for every storage cycle; a direct-write EEPROM need only be cycled when a change is made in the state of the information stored in that EEPROM.

Shadow RAMs that do not require a separate erase cycle are available in the art, but they are incapable of flash storage or recall; i.e. they cannot transfer all data simultaneously; each word line must be correlated through reference to a sense amplifier, slowing the transfer of data.

Several problems associated with providing non-volatile memory remain. Shadow RAMs of the art all have shortcomings: (1) They consume too much space on a chip. All known shadow EEPROM devices are at least twice the size of a DRAM array of the same capacity. (2) They often require a separate erase cycle to accomplish transfer of data between volatile and non-volatile elements. This gives rise to two drawbacks: time is consumed in an extra step and the lifetime of the device is shortened. EEPROMs fatigue from use, a typical flotox EEPROM being good for about 10,000 erase/write operations. If only 10% of the bits of information need to be changed in one cycle, then a device that changes only the bits that are different will last almost ten times as long as a device that erases and writes every cell in every cycle. (3) They are significantly more expensive to fabricate than simple DRAM arrays which makes them uncompetitive in comparison to a standard DRAM with an auxiliary power supply.

DISCLOSURE OF INVENTION

It is an object of the invention to provide a shadow RAM that occupies no more than 120% of the space of a DRAM alone.

It is a further object of the invention to provide a direct-write shadow RAM so that a separate erase cycle is not necessary to write information into the non-volatile memory.

It is a further object of the invention to provide a shadow RAM whose fabrication costs are not significantly higher than those of a simple DRAM array.

It is a further object of the invention to provide a shadow RAM that requires only two voltage levels to perform all of its functions.

It is a further object of the invention to provide a process for fabricating a shadow RAM that avoids the creation of structural elements whose critical dimensions are difficult to control with conventional technology.

The invention relates to a semiconductor device memory array having a multiplicity of field effect transistor DRAM devices formed on a semiconductor substrate. The DRAM devices are preferably disposed in rows and columns and each of the DRAM devices is paired with an EEPROM cell. The columns are preferably at an angle of about 45° to the rows; to the rows; most preferably the DRAMs are in quarter-pitched array. The EEPROM cells are disposed in a shallow trench in the semiconductor substrate running diagonally between the quarter-pitched DRAM devices such that each DRAM-EEPROM pair shares a common drain diffusion. The DRAM devices may be stacked capacitor memory cells, or preferably the DRAM devices are deep trench storage capacitor memory cells. Preferred EEPROM cells in the arrays according to the invention comprise a pair of continuous polysilicon structures that function as program and recall gates and a plurality of discontinuous polysilicon structures that function as floating gates. Preferably the polysilicon floating gates are disposed along opposite walls of the shallow trench and separated from the silicon substrate in which the trench is cut by a high dielectric material such that when a charge resides on one of the floating gates, an inversion is induced in the substrate adjacent the floating gate. The continuous polysilicon program and recall gate structures are parallel and are separated by a high dielectric material. The recall gate is disposed along the bottom of the shallow EEPROM trench and extends below the P/N boundary in the silicon substrate. It is preferred that the laterally disposed floating gate structures and the vertically disposed program and recall gate structures are separated by a material that permits Fowler-Nordheim tunneling. Preferably this material is silicon rich nitride, although a silicon rich oxide could be used.

This invention further relates to a memory cell array formed relative to a surface of a semiconductor substrate. Preferably the substrate is bilayered. The memory cell array comprises:

(a) at least four rectangular trenches aligned in two parallel rows offset such that corresponding elements of said rectangular trenches fall on a diagonal line which is at about 45° to said parallel rows, each rectangular trench containing an electrode surrounded by an insulator;

(b) at least one elongated, linear trench oriented parallel to said diagonal line, said elongated trench having first and second side portions and a bottom portion which is below a boundary between layers when the semiconductor substrate is bilayered;

(c) at least one first electrode disposed in one of said elongated trenches such that each trench contains a first electrode, each of said first electrodes being coupled to a voltage source and each of said first electrodes having a first surface portion;

(d) a plurality of second electrodes, disposed at said first side portion of one of said elongated trenches such that each second electrode is adjacent one rectangular trench on its side of said elongated trench, each of said second electrodes having a second surface portion disposed adjacent said first surface portion of a respective one of said first electrodes for receiving injected electrons therefrom, and each of said second electrodes having a third surface portion;

(e) a plurality of third electrodes disposed at said second side portion of one of said elongated trenches such that each third electrode is adjacent one rectangular trench on its side of said elongated trench, each of said third electrodes having a second surface portion disposed adjacent said first surface portion of a respective one of said first electrodes for receiving injected electrons therefrom, and each of said third electrodes having a third surface portion;

(f) at least one fourth electrode disposed in one of said elongated trenches such that each trench contains a fourth electrode, each of said fourth electrodes being coupled to a voltage source; and (g) an elongated diffusion region, said diffusion region being parallel to said elongated trench and disposed between adjacent ones of said rectangular trenches, said elongated diffusion region being coupled to a signal source.

Preferably the memory cell array comprises a plurality of elongated, linear diagonal, substantially parallel trench segments formed in the surface of the substrate, each of these elongated trench segments connected by connecting trench segments parallel to the rows of rectangular trenches. In the preferred embodiment, electrical connections are provided in these connecting trench segments. In the preferred memory cell array, said elongated trench cuts through one corner of each of said rectangular trenches, and said elongated trench bottom is below a boundary between layers of said bilayered semiconductor substrate; said first electrode is disposed at said bottom portion of one of said elongated trenches; said fourth electrode is disposed at said upper portion of one of said elongated trenches; each of said fourth electrodes has a fourth surface portion disposed adjacent said third surface portions of respective ones of said second and third electrodes for receiving electrons injected therefrom; and said diffusion region is additionally coupled to said electrodes in said rectangular trenches.

The preferred memory cell array comprises a DRAM cell and an EEPROM cell. The first electrodes are recall gates, the second and third electrodes are floating gates, the fourth electrodes are program gates, and the rectangular trench electrodes are DRAM capacitors.

The invention further relates to an EEPROM memory array formed in a semiconductor substrate, said EEPROM array comprising:

(a) a groove formed in said substrate;
(b) a first continuous electrode coupled to a first voltage source;
(c) a second continuous electrode coupled to a second voltage source;
(d) a plurality of discontinuous electrodes;
(e) an electrically insulating material separating all of said electrodes from said substrate, said first and second electrodes from each other, and said discontinuous electrodes from one another; and
(f) a material that allows electrons to tunnel between said discontinuous electrodes and said first and second electrodes.

Preferably the first electrode which functions as a recall gate is disposed at the bottom of the groove, the second electrode which functions as a program gate is disposed at the top of said groove and the discontinuous electrodes which function as floating gates are disposed along two sides of the groove.

The invention further relates to an EEPROM cell comprising a first electrode which functions as a recall gate, a second electrode which functions as a program gate, and at least two third electrodes which function as floating gates wherein said first and second electrodes are T-shaped in cross section, said first electrode is in inverted T orientation, said second electrode is in upright T orientation, the main axes of both electrodes are aligned vertically and said two third electrodes occupy regions on opposite sides of said vertically aligned first and second electrodes within a vertical region defined by horizontal elements of said T-shaped first and second electrodes.

The invention further relates to a method for oxidizing a top surface of a pair of polysilicon structures in a trench comprising:
(a) conformally depositing polysilicon in the trench and RIE directionally etching said polysilicon to provide a pair of polysilicon structures vertically aligned along sidewalls in the trench;
(b) filling the trench with a fill, planarizing and etching back the fill to expose the top surfaces of said structures;
(c) oxidizing the top surface of said polysilicon structures; and
(d) removing the fill.

The fill may be a conformal nitride covered with a resist or a spin-on glass.

The invention further relates to a method for providing a polysilicon electrode in a trench, said polysilicon electrode being in the form of an inverted T, comprising
(a) depositing a first polysilicon layer in the trench, planarizing and etching back to provide a base of said electrode, said base filling a lower portion of the trench;
(b) providing an oxide layer on top of said base;
(c) depositing a non-erodible material on both sidewalls of the trench;
(d) etching away an exposed center portion of said oxide layer on said base; and
(e) depositing a second polysilicon layer on top of said base of said electrode.

In a similar embodiment, the invention relates to a method for providing a polysilicon electrode in a trench, said polysilicon electrode being in the form of an inverted T, comprising:
(a) depositing a first polysilicon layer in the trench, planarizing and etching back to provide a base of said electrode, said base filling a lower portion of the trench;
(b) providing an oxide layer on top of said base;
(c) depositing a structure on both sidewalls of said trench and coating an upper surface of said structure with a layer of oxide which is substantially thicker than said oxide layer on said base;
(d) etching said oxide layers on said upper surface of said sidewall structures and etching on said exposed portion of said oxide on said base for a period of time just sufficient to remove substantially all of said exposed oxide on said base; and
(e) depositing a second polysilicon layer on top of said base of said electrode.

In a further aspect the invention relates to a coupled DRAM-EEPROM circuit comprising:
(a) an input terminal;
(b) a controlled terminal;
(c) a field effect transistor (FET) having a current channel and a control electrode for receiving a signal; a first end of said channel being connected to said input terminal;
(d) a storage capacitor coupled to a second end of said channel;
(e) a second FET having a control electrode for receiving a signal, a floating gate, and a current channel, a first end of said second FET current channel being coupled to said second end of said first FET channel and to said capacitor;
(f) a third FET having a control electrode for receiving a signal and a current channel, a first end of said third FET channel being coupled to a second end of said second FET channel; a second end of said third FET channel being coupled to said control terminal;
(g) said floating gate of said second FET being capable of receiving electrons by tunneling from said third FET control electrode; said floating gate of said second FET being capable of discharging electrons by tunneling to said second FET control electrode; and
(h) said storage capacitor having a higher capacitance than a capacitive load provided by said second and third FETs.

This aspect of the invention is illustrated in FIG. 10 which shows a coupled DRAM-EEPROM circuit as described. When the first FET control electrode and the third FET control electrode are at ground, the storage capacitor and the second FET are isolated, allowing the second FET control electrode to modulate a transfer of electrons to the floating gate from the third FET electrode as a function of the condition of the storage capacitor. An alternate way of conceptualizing the invention is as a coupled DRAM- EEPROM circuit wherein the first FET and storage capacitor comprise a DRAM, the second and third FETs comprise an EEPROM which can exist in one of two states and the storage capacitor controls the state of the EEPROM.

In a preferred embodiment of the coupled DRAM-EEPROM circuit, the second FET control electrode and the third FET control electrodes are controlled independently at ground or at a single control signal voltage, preferably between ten and eighteen volts. This control voltage may be supplied by an on-chip voltage device.

In a further aspect the invention relates to a paired DRAM-EEPROM cell wherein the DRAM comprises a FET and a storage capacitor, which exists in one of two states, and the EEPROM exists in one of two states. The EEPROM state is determined by the state of the storage capacitor to which it is directly coupled. These cells may form an array of paired DRAM-EEPROM cells wherein each cell is addressed solely through the DRAM component.

The generic invention exhibits several advantages: (1) By using an EEPROM in a trench in an array of DRAMs, a shadow RAM is provided at the expense of less than 20% increase in space requirements. (2) By using an EEPROM as the non-volatile component, the device can be readily fabricated with standard technology. (3) By using a common drain diffusion for both the DRAM and the EEPROM, high density is provided and fabrication is facilitated. In addition, the generic invention allows specific embodiments having additional advantages.

The specific embodiments described below exhibit additional advantages and features: (1) the memory cell has "flash store" capability i.e. it is possible to transfer the data of an entire chip from the DRAM to the EEPROM simultaneously. (2) The memory cell has "flash recall" capability i.e. it is possible to transfer the data of an entire chip from EEPROM to the DRAM simultaneously. (3) The flash store and flash recall operation can be non-destructive i.e. the operation will not disturb the original data in the DRAM or the EEPROM. (4) The cell can be used with a low (3 to 5 volt) single voltage external power supply. (5) The EEPROM may be directly written to and the erase cycle may be avoided. (6) High voltage is restricted to the polysilicon electrodes and is not applied to diffused junctions in the cell array. Thus a device according to the invention is compatible with future scaling of cell sizes and design rules. (7) Only two voltage levels (either on or off) are required for all the control voltages. (8) The process for the fabrication of devices of the invention requires two-three masks beyond those required for the DRAM to create the EEPROM structure. (9) The use of T-shaped electrodes increases the surface area available for the transfer of electrons to and from the floating gates. These and other objects and features of the invention will be obvious from the description and the drawings.

BEST MODE FOR CARRYING OUT THE INVENTION

Figure 1:
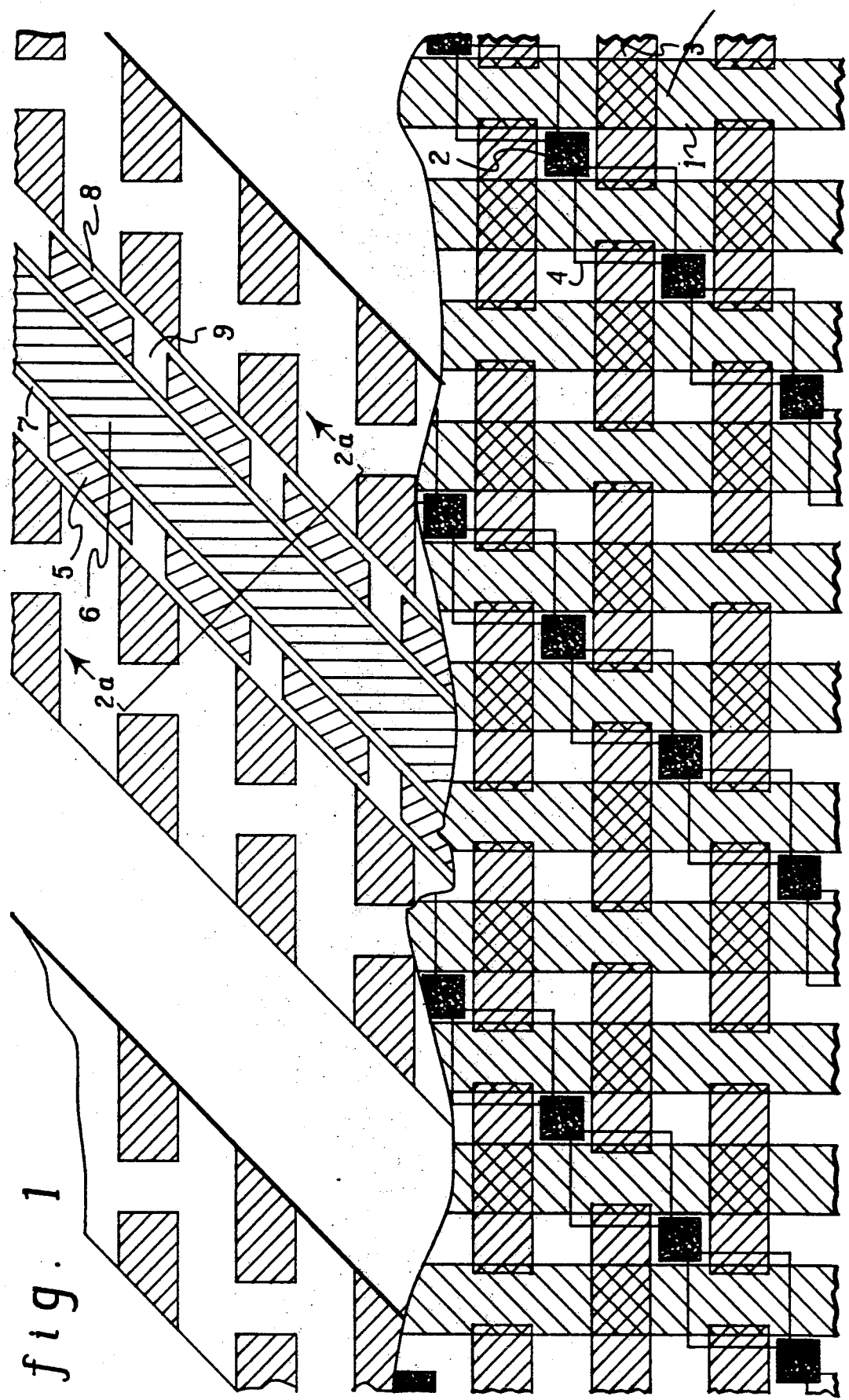
FIG. 1 is a top view of a semiconductor device memory to the invention.

FIG. 1 shows a top view of a semiconductor device memory array according to the invention. The bottom half of FIG. 1 shows a plan view or pattern layout at the surface; the top half of FIG. 1 shows a cutaway view of one particular embodiment of the invention which will be described below. The cutaway is at one-half the trench depth. The organization of the particular array illustrated is standard quarter pitched; each element repeats every fourth word line or bit line. This is a particularly advantageous array pattern, but the invention is not restricted to quarter-pitched arrays. Deep trench polysilicon storage capacitors 3 are located between the word line 1 and the bit line for which contact 2 is shown. Between pairs of deep trenches 3 adjacent the contacts 2 are shallow trench isolations 4 to block stray surface currents. From study of the bottom half of FIG. 1, it will be noted that the standard quarter pitched array leaves a previously unutilized area of silicon substrate along a diagonal defined by the ends of the deep trench capacitors 3 at which no contacts 2 are located. As shown in the top half of FIG. 1 the EEPROM trench has been introduced along this diagonal. The EEPROM trench contains a discontinuous series of polysilicon floating gates 5, a continuous polysilicon recall gate 6, a continuous polysilicon program gate (22 in FIG. 5), an isolating oxide 8 and a silicon rich dielectric 7 between the floating gates 5 and the recall gate 6 and between the floating gates and the program gate 22.

Figure 2A:
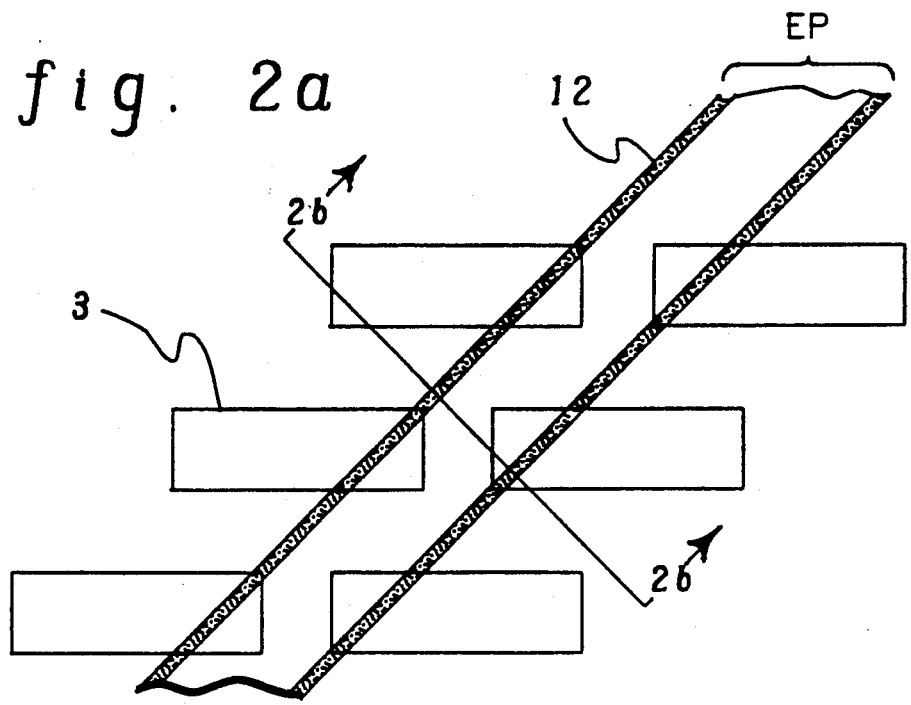
FIG. 2A is a top view and FIG. 2B is a cross section of an embodiment at the step of the process to create the EEPROM trench.
Figure 2B:
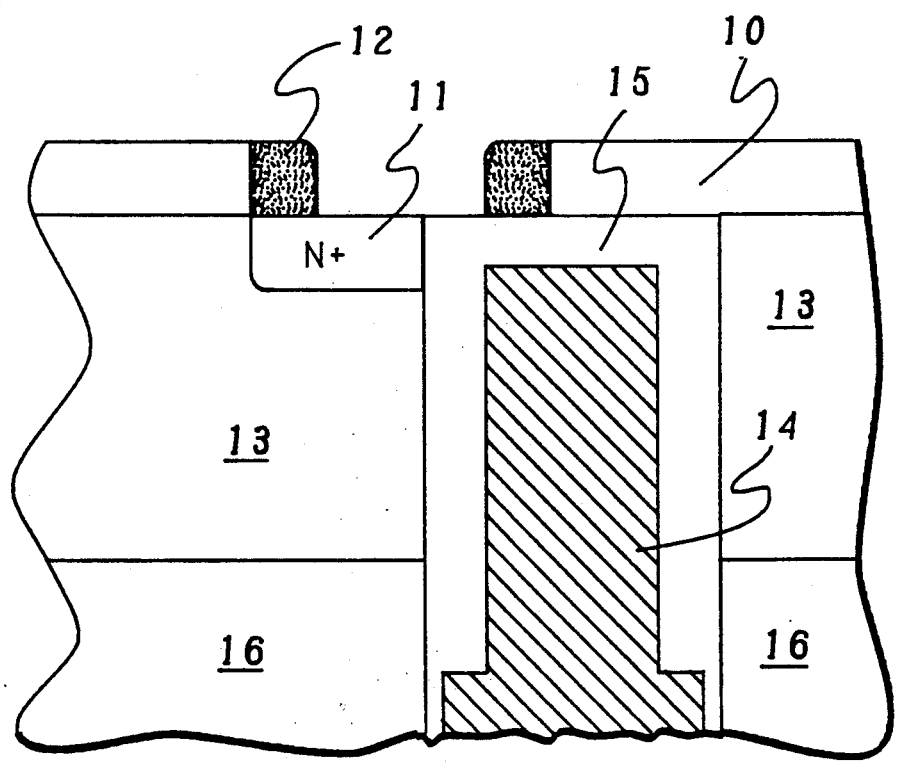

The fabrication of the device will be described in the series of FIGS. 2 through 5 which represent cross sections of the device taken through the EEPROM trench and adjacent deep trench storage capacitor along a plane defined by the line 2b in FIG. 2. The process of the invention starts after the well (in the case of this embodiment a P-well) and the deep trench capacitor of a standard DRAM are defined. A mask composed of a non-erodible material or a combination of non-erodible materials is defined. This mask is preferably aluminum oxide but could be a thick pad nitride or could be a series of selectively erodible materials such that, as each processing step took place, a layer of the mask was removed until the last step of the process both produced the completed device and removed the final mask layer. A multi-layer resist structure is used to define a pattern in the non-erodible material. The layout of the EEPROM trench image is shown in top view in FIG. 2A, cutting diagonally through the open area and through the edges of the deep trench 3 in the quarter pitched cells. After the multilayer resist is defined and used to etch through the non-erodible material 10 in FIG. 2b, it is removed. An N+ implant 11 is defined in the P-well 13. After implantation, a spacer 12 is defined over the vertical edge of the EEPROM trench mask. The spacer can be the same material as the non-erodible mask (aluminum oxide) or could be other non-erodible material. The spacer may be deposited by chemical vapor deposition and then RIE (reactive ion etch) etched (RIE) to provide a spacer which is smaller than the minimum feature that could otherwise be created by photolithography. The cross-section in FIG. 2B illustrates the non-erodible EP mask 10, spacer 12, and N+ implant 11 in reference to the P-well 13, the N substrate 16, the polysilicon DRAM capacitor 14, and its silicon oxide collar 15.

Figure 3A:
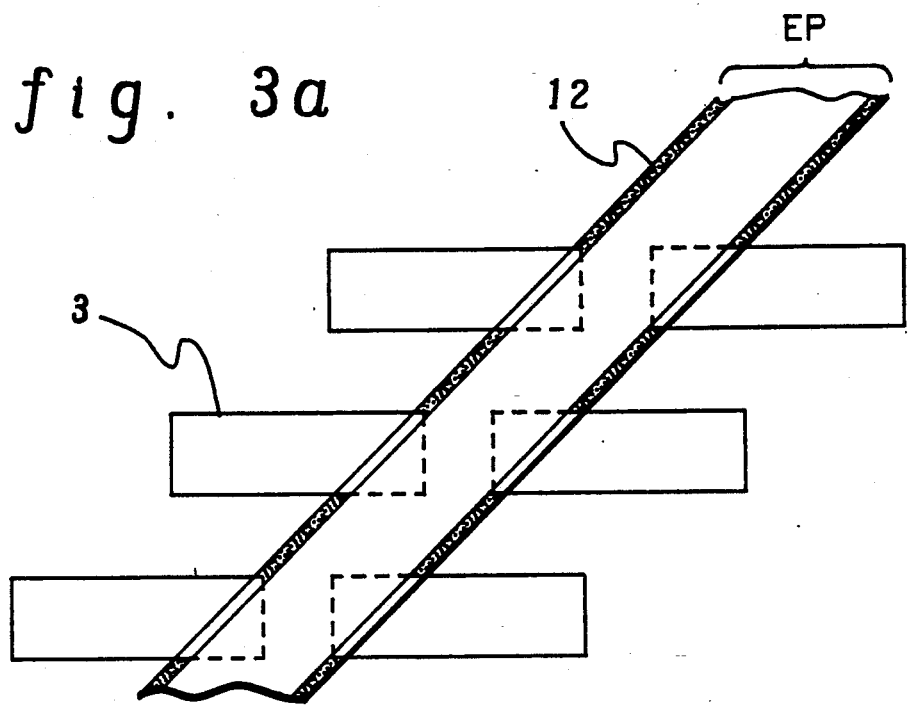
FIG. 3A is a top view and FIG. 3B a cross section showing an embodiment at an intermediate stage of fabrication.
Figure 3B:
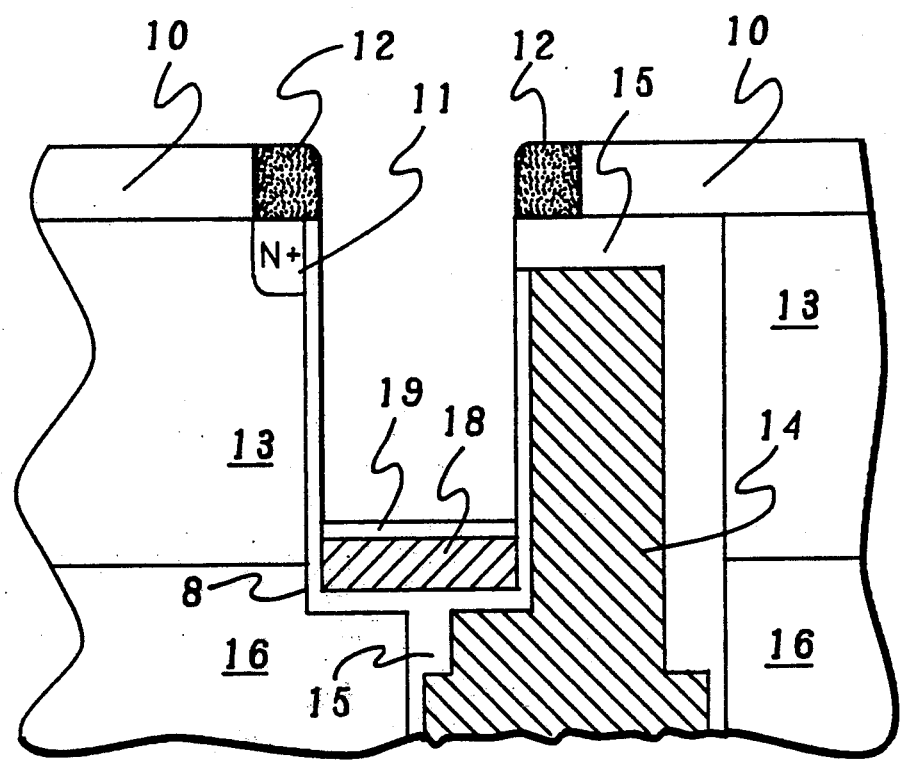

FIG. 3 illustrates the next steps of the procedure. Using the non-erodible material (NEM) 10 combined with spacer 12 as a mask, the EEPROM trench is etched to a depth below the level of the well. This etching is preferably done by reactive ion etching (RIE) with a mixture such as $CF_4$ plus oxygen that etches both silicon and silicon oxide at about the same rate. The exposed silicon and polysilicon surfaces of the trench are oxidized by processes well known in the art to produce a silicon oxide layer 8 about 300Å thick in this embodiment in which the trench is about $2\mu$ deep and $2\mu$ wide. The recall gate polysilicon 18 is deposited to fill the EP trench, planarized by suitable means, preferably chemical- mechanical polishing, flush with the non-erodible mask, and recessed back by a timed etch to the level shown, i.e. a device length above the boundary between the P- well 13 and the N substrate 16. The sidewall oxide 8 that has been uncovered is stripped and the silicon surfaces of the P-well 13 and the polysilicon capacitor 14 are re-oxidized to form a 200Å gate oxide. This oxidation also oxidizes the top surface of the recall gate polysilicon 18. The oxidation grows three times more oxide on the polysilicon surfaces than on the single crystal surfaces, a feature which is useful later as an etch stop.

Figure 4:
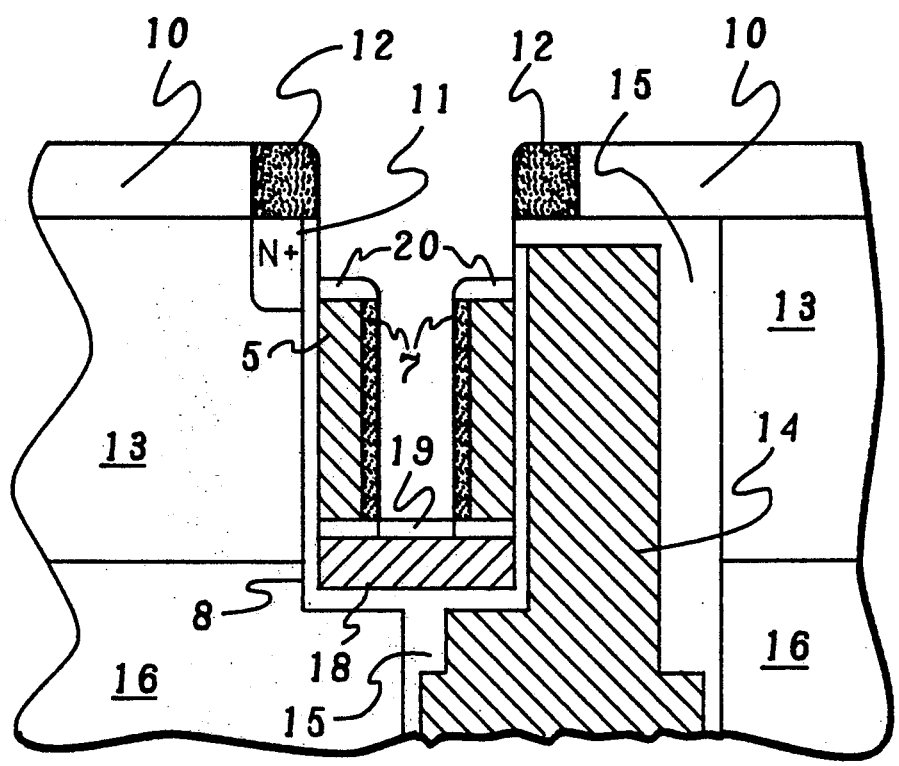
FIG. 4 is a cross section at yet a further stage of fabrication.

FIG. 4 illustrates the next steps of the process. A floating gate polysilicon layer is deposited and RIE recessed back to form continuous sidewall floating gates 5. The oxidized surface 19 of the recall gate 18 is used as an etch stop. The floating gate polysilicon 5 is recessed back to a level below coplanarity with the P-well 13 surface but still maintaining overlap with the sidewall diffusion 11. Next a thin nitride is conformally deposited (not shown). A second mask is applied which allows the nitride film to be cut in the areas (FIG. 1, number 9) where segments of the continuous polysilicon floating gate 5 are to be removed. The mask, which is preferably comprised of resist, cuts diagonally across the EP trench such that floating gate polysilicon 5 is left between the DRAM capacitor trenches 3 as shown at the top of FIG. 1. This maximizes the overlap of the floating gate polysilicon 5 with the N+implant 11 which is also interrupted by the DRAM capacitor trenches 3. Using the conformal nitride as a sidewall mask, the continuous floating gate polysilicon 5 is oxidized away in the areas where it is not needed. The conformal nitride is stripped. As best visualized from FIG. 1, this approach results in a silicon oxide spacer between adjacent floating gates on the sidewalls of each trench.

Figure 6:
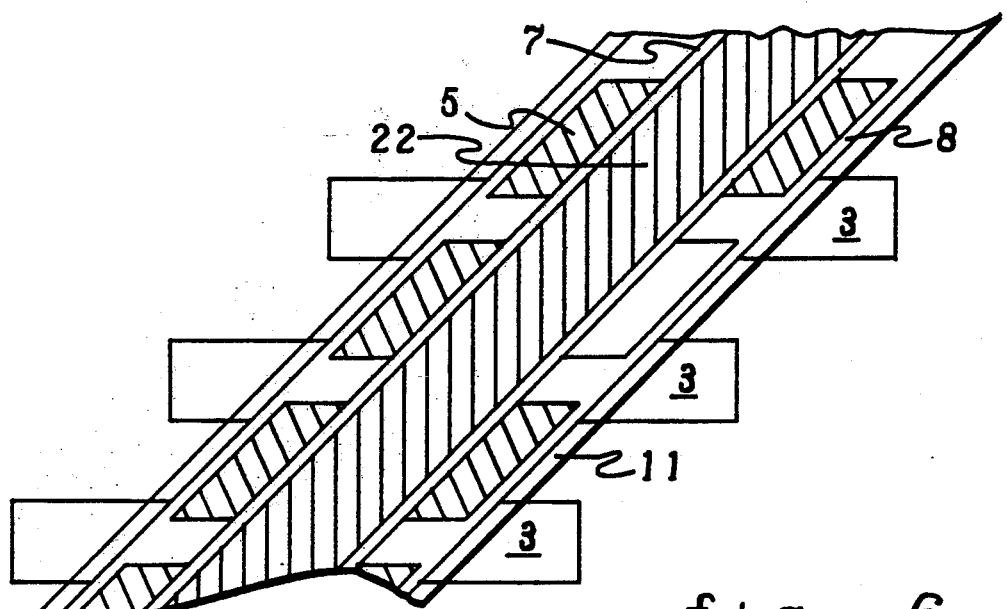
FIG. 6 is a horizontal cross-section of an alternate embodiment in its final form.

Alternatively, polysilicon can be removed from each trench sidewall to define the discrete floating gates using only the resist mask as a control. In etching polysilicon material cleanly between discrete floating gate structures, openings are created therebetween which will ultimately be filled by a silicon rich nitride material pursuant to the further processing steps described below (rather than a silicon oxide as in the above approach). This alternate embodiment is shown in FIG. 6 which is a horizontal cross-section at the level of the bottom of the N+well 11.

A nitride sacrificial material is used to conformally coat the EEPROM trench. This is followed by a resist fill and etch back to remove the conformal nitride down to the level of the top edge of the floating gate polysilicon 5. The resist is stripped and the exposed silicon on the top edge of the floating gates 5 and the sidewalls of the trench above the floating gates are oxidized. This oxidation must produce a layer of $SiO_2$ 20 that is significantly thicker than the $SiO_2$ 19 on top of the recall gate 18 as shown in FIG. 4. The sacrificial nitride is removed.

A silicon-rich nitride (SRN) is conformally deposited and RIE recessed back to form spacers 7 on the sidewalls of the floating gates 5. Silicon-rich nitride is a composition having the empirical formula $S_nN_4$ where n is a number between 3.3 and 4.5; i.e. a composite comprising silicon nitride, $Si_3N_4$, containing 10 to 50 atom percent excess of silicon. It is described in L. DoThanh et al. in "Injection properties of Silicon-Rich Silicon Nitride Layers on $SiO_2$", *Insulating Films on Semiconductors* J.J. Simone and J. Buxo ed North Holland (1986) Amsterdam, p. 255–258 which is incorporated herein by reference. SRN allows passage of electrons at lower fields than do conventional tunnel oxides. This has significant advantages in the practice of the invention. It allows a thicker layer between the floating gate and the program and recall gates. A thicker layer means processing parameters for the deposition and etching are less critical. In addition, the nature of the interfaces between SRN and the polysilicon gates are not as critical. Because low field leakage of electrons from the floating gate may become a problem, the SRN is preferably CV deposited as a three layer "sandwich": a first layer of about 200Å of SRN, a second layer of about 50–100Å of $SiO_2$ and a third layer of about 200Å of SRN. The term silicon rich nitride (SRN) layer throughout this application refers to this sandwich structure. Silicon rich oxide (SRO) could be used in place of SRN, but it is more difficult to maintain the integrity of SRO through integrated processing sequences.

The silicon oxide 19 on top of the recall gate 18 is opened by an etch. This etch also removes a portion of the cap oxide 20 on the top of the floating gates 5.

Figure 5:
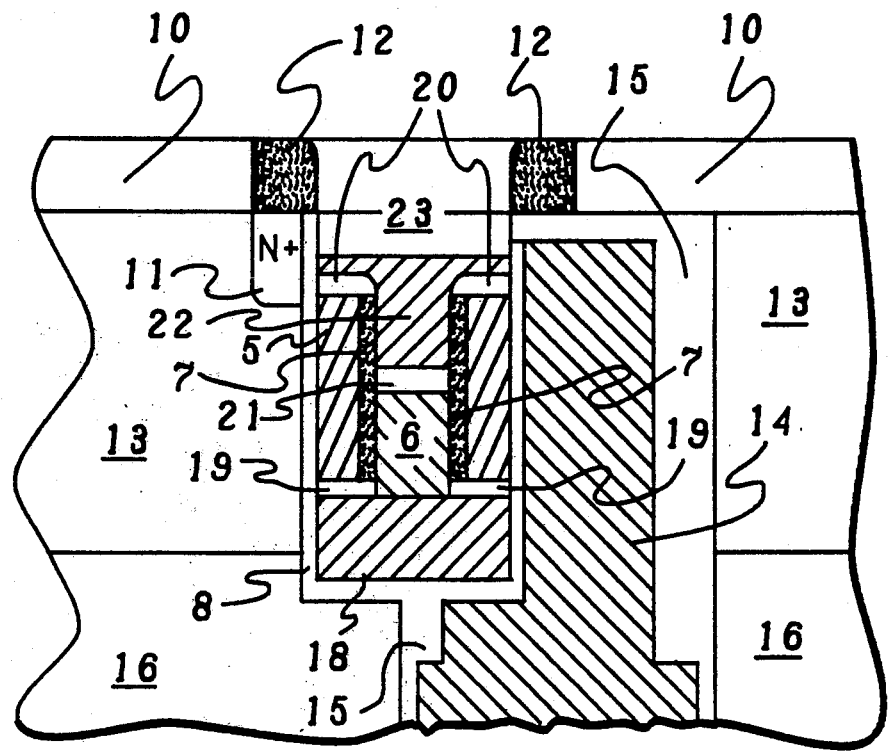
FIG. 5 is a cross section of an embodiment in its completed form.

FIG. 5 illustrates the remaining steps of the process. A polysilicon layer is deposited, planarized by chemical-mechanical polishing and RIE recessed back into the trench to provide an extension 6 of the recall gate 18. Although the two polysilicon masses 6 and 18 are deposited in separate steps, they perform their recall gate electrical function as a single unit. The surface of the recall gate extension 6 is oxidized to provide silicon oxide layer 21. Once again a polysilicon layer is deposited, planarized and RIE recessed back below the top surface of the P-well 13 to provide a program gate 22. It is important that the top of the program gate 22 be below the top surface of the deep trench capacitor 14 because the process of opening the deep trench capacitor for forming straps must not expose the top surface of the program gate. It should be pointed out that connections to the deep trench capacitor 14 are possible on either side of the capacitor depending on the cell design. Finally an oxide 23 is deposited and planarized back. The non- erodible material 10 and 12 is stripped and further processing is continued as known in the art for fabricating the DRAM.

Figure 7:
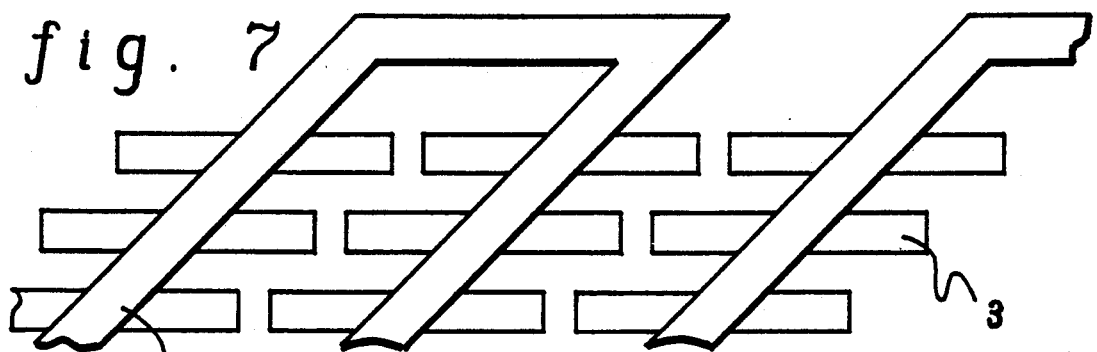
FIG. 7 is a plan view of a portion of a chip showing EEPROM trench and the quarter-pitched array of DRAMs.

Further processing would include providing contacts with the recall gate 6/18 and the program gate 22. These connections may be made in the EEPROM trenches where they pass outside the array. As shown in FIG. 7, the EEPROM trench is continuous and the program and recall gates, which run the entire length of the trench, are common to an array segment. In the course of the process, dummy (i.e. non-functional) floating gates are created in the connections of the EEPROM trenches that are outside the array. If required, these non-functional floating gates could be cut out by the floating gate mask at the time the continuous floating gate is severed into the individual discontinuous floating gates. Contacts to the recall gate and the program gate are accomplished with a mask that allows one to open the cap oxide and etch completely through the program gate 22 as well as the cap oxide 21 on the recall gate 6 and any floating gate 5 (if it is present in the external connector). Oxide is deposited on all of the exposed areas except the top surface of the recall gate 18 where electrical contact is established. A second mask is used to open the oxide on top of the program gate 22 in other areas. Finally, the deep trench capacitor strap mask could be used to make contact to the program gate and recall gate opened areas.

A memory array constructed as described above occupies less than 1.2 times the space of the original quarter-pitched DRAM array.

Figure 8:
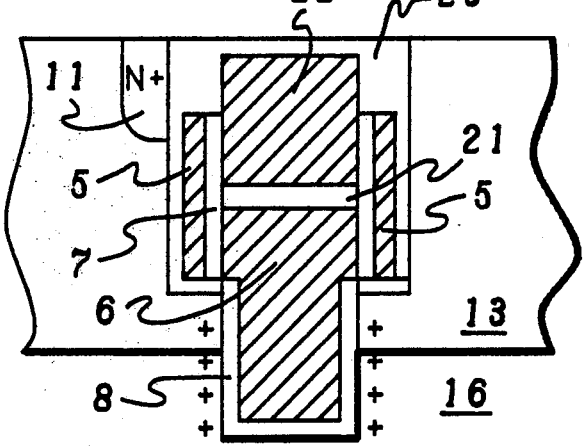
FIG. 8 is a cross section of an alternate embodiment of an EEPROM trench.

An alternate arrangement of the electrical elements of an EEPROM in the trench are illustrated in FIG. 8. In this case the recall gate 6 is placed in the trench after the deposition of the floating gates 5. The initial steps are the same as in the first embodiment up to the cutting of the EEPROM trench in the semiconductor substrate; however, in this case the EEPROM trench is displaced slightly so as to provide a second lower trench to be discussed below which does not impinge on the DRAM capacitor. The NEM mask plus spacer therefore define an opening such that the oxide collar of the DRAM cell is just covered. A trench is etched into the P-layer but not through into the N substrate. The walls and floor of the trench are oxidized as before and a polysilicon layer is deposited, planarized and recessed back in the trench to form two continuous sidewall floating gates 5 which have exposed top and side surfaces. The top surface is substantially overlapping the sidewall N+ implant but below the level of the NEM mask. The sidewall floating gates are cut and oxidized as before along parallel lines centered longitudinally on each row of DRAM cells to form a series of discontinuous polysilicon floating gates. Silicon rich nitride is conformally deposited and etched back to form a vertical spacer 7 on the side surface of the floating gates. After the poly gates sidewall are defined. A nitride sacrificial material is used to conformally coat the EEPROM trench. This is followed by a resist fill and etch back to remove the conformal nitride down to the level of the top edge of the floating gate polysilicon 5. The resist is stripped and the exposed silicon on the top edge of the floating gates 5 and the sidewalls of the trench above the floating gates are oxidized. The sacrificial nitride layer is stripped. A silicon-rich nitride layer is conformally deposited and RIE etched to form spacers among the sidewalls of the floating gates. A SiO2 spacer (to protect the silicon rich nitride layer) is defined. Using the SiO2 thermally grown on the top of the floating gate a second trench is etched into the N+ buried plate. An angled ion implant is done to adjust the threshold voltage of the recall gate device. Polysilicon is deposited and recessed to form a recall gate 6 which fills the lower trench and extends about half way up the silicon rich nitride layer 7 on the side surface of the floating gates. The top surface of the recall gate polysilicon is oxidized 21 and the program gate 22 polysilicon is deposited, planarized and recessed below the boundary between the first non-erodible mask and the surface P-layer. Finally, the non-erodible masks are removed and the resulting cavity filled with oxide 23 up to the level of the surface of the semiconductor.

Figure 9:
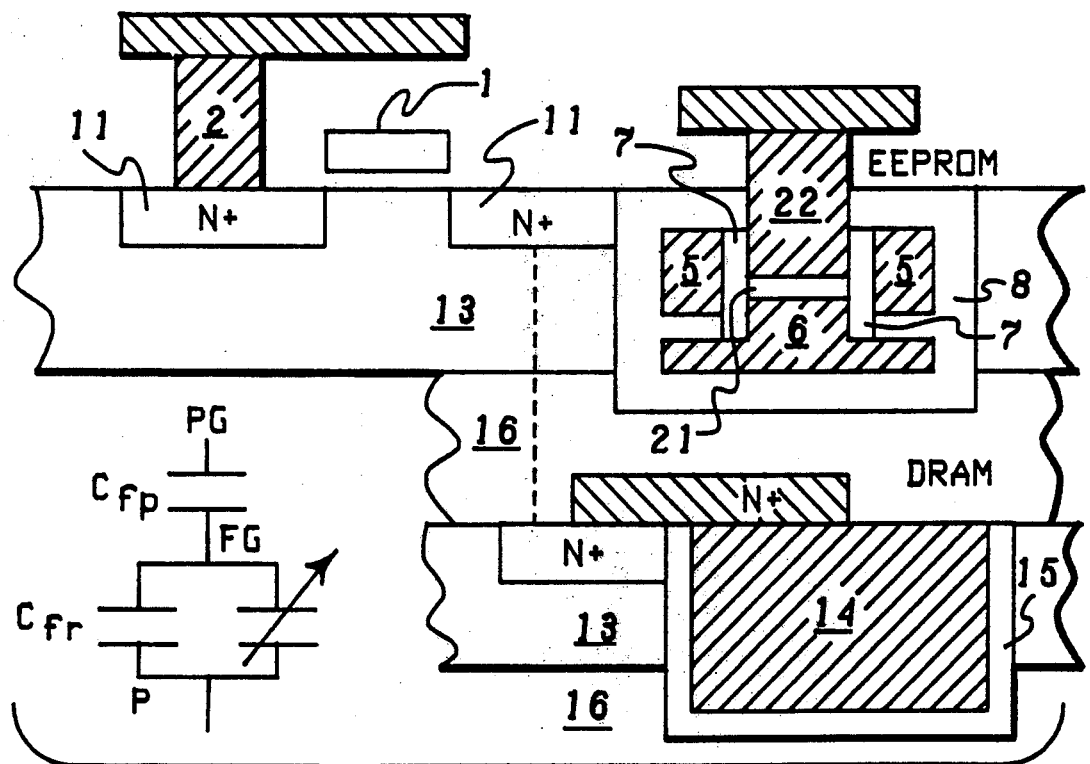
FIG. 9 is a diagrammatic representation of the EEPROM and associated DRAM including a diagram of the capacitance network.

FIG. 9 shows a schematic of the cell. The N+ region of the EEPROM is identical to the N+ region of the DRAM. A capacitance network having a variable capacitance at the floating gate (FG) node is utilized to create the EEPROM operation. The value of the voltage on the floating gate ($V_{fg}$) is the result of a capacitive divider network: $V_{fg}$ is equal to a capacitance coupling ratio (CR) times the voltage on the program gate ($V_{pg}$). The capacitance coupling ratio (CR) is equal to $$\frac{C_{fp}}{C_{pf} + C_{fr} + C_{fc}}$$

where $C_{fp}$ is the capacitance between the floating gate and the program gate, $C_{fr}$ is the capacitance between the floating gate and the recall gate, and $C_{fc}$ is the capacitance between the floating gate and the channel. $C_{fc}$ is a variable capacitance which is a function of the condition of the sidewall channel.

$$C_{fc} = \frac{C_{ox} C_{si}}{C_{ox} + C_{si}}$$

where $C_{ox}$ is the capacitance of the oxide between the floating gate and the sidewall channel and $C_{si}$ is the depletion capacitance of the silicon sidewall. When the sidewall channel is coupled to ground $C_{fc} = C_{ox}$. The EEPROM device thus operates by modulating $C_{si}$ with voltage.

Figure 10:
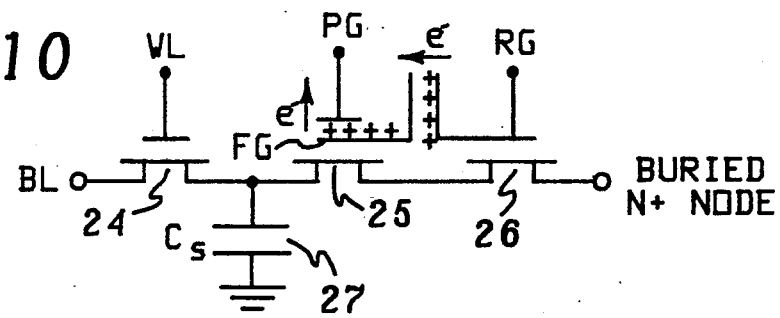
FIG. 10 is an equivalent circuit diagram.

FIG. 10 shows the equivalent circuit of the combined DRAM and EEPROM cell. There is no EEPROM device in the DRAM path as defined by transistor 24 and storage capacitor $C_s$ 27. The DRAM cell operates just like a conventional DRAM in terms of voltage level, performance, signal level, noise, etc. The EEPROM device shares the same diffusion node as the storage capacitor. The storage capacitor, which may be trench or stacked, is much larger in value than the capacitive load introduced by the EEPROM device capacitance. The EEPROM transistor 25 is connected in series with recall transistor 26. During DRAM operation, the recall gate is at ground as is the programming gate potential such that this path is not active. The recall gate (RG) capacitively couples to the floating gate (FG) as does the programming gate (PG). In addition, localized field enhancement is achieved by depositing SRN film, actually Silicon Rich Nitride film with a pure SiO2 film, or silicon rich oxide (SRO) which gives localized field enhancement and reduces the Fowler Nordheim tunneling threshold to less than 10 volts. This injection film can be referred to as silicon rich dielectric (SRD). Under the proper conditions, electrons can tunnel from RG to FG or from FG to PG. The presence or absence of electrons on the floating gate results in a higher or lower threshold value for transistor 25. In case of power failure, transistor 24 is shut off, isolating the storage capacitor from the bit line. The recall gate is kept at zero potential keeping transistor 26 off. The storage capacitor and the EEPROM device remain connected together but totally isolated from the bit line and the buried N+ node This isolation is required for reliable transfer of data from the volatile capacitor medium to that of the floating gate EEPROM device. It is now possible to simultaneously store every bit of data on $C_s$ to its corresponding EEPROM FG device. All electron transfers to and from the floating gates are poly to poly transfer at lower average electric fields due to presence of the SRN sandwich injectors. No thin tunneling oxide to diffusion or substrate is required for the tunneling process. Direct write is used with no erase before write requirement.

Figure 11:
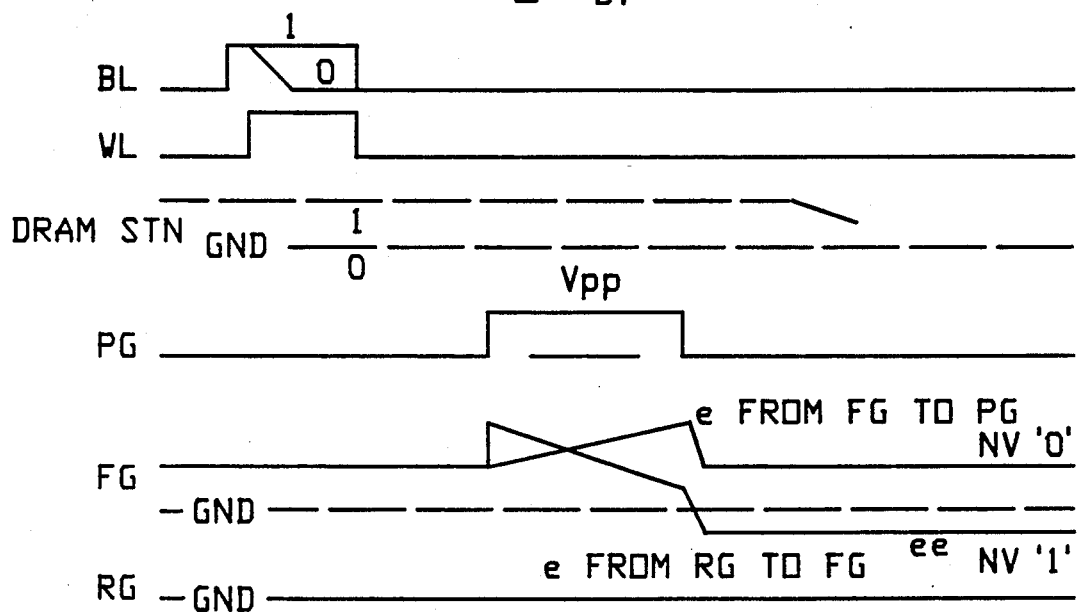
FIG. 11 is a timing diagram for a flash store operation.

FIG. 11 shows the timing waveforms associated with the simultaneous store ("flash store"). The word line connected to the gate of transistor 24 stays positive long enough to ensure the completion of the bit line transfer of information to the storage capacitor $C_s$. The word line voltage then drops to zero and isolates the capacitor and EEPROM node of transistor 25 from the bit line.

The storage node is at a positive voltage or ground shown as "1" or "0." The programming voltage of approximately 15 volts is applied to the programming gate which creates a potential well in the p substrate below the channel region of the EEPROM. Electrons will stay trapped in this well for hundreds of milliseconds if the storage node of $C_s$ is at zero volts, resulting in a surface channel region at zero volts. If the storage node is at a positive voltage, then electrons will be rapidly swept from the well leaving a diffusion capacitance between the channel and substrate modulating the capacitor shown in FIG. 9. The FG will rise to approximately 12V, as shown in FIG. 11, and electrons will flow from the recall gate to the floating gate if the small depletion capacitor is in series with the larger FG to Channel device oxide which results in loose coupling of FG to the substrate relative to the coupling to PG. If there is no depletion capacitance because of the presence of a channel at zero volts under the floating gate, then FG is tightly coupled near ground and there is a large difference between FG and PG and any electrons present will be collected by the PG. There is no need to pre-erase the EEPROM device prior to writing and therefore FIG. 11 shows no erase cycle and the information is directly written to the new state independent of the state of the floating gate. If the information on the floating gate is the same as that on the storage node, there will be no electron flow, and Fowler Nordheim charge will flow through the oxide only when the information is different. This extends the cyclability of the structure. After the PG is returned to zero, FG will be at a positive voltage or a negative voltage as shown in FIG. 11. At this point, all power shuts off, the charge on $C_s$ discharges to zero and the device will store the information in the floating gate without power. RG remains at zero volts to isolate the EEPROM device during this entire cycle. The entire operation is performed with no high voltages on any array diffusions. High voltage in the array region appears only on poly lines which act as capacitors and draw no DC current.

Figure 12:
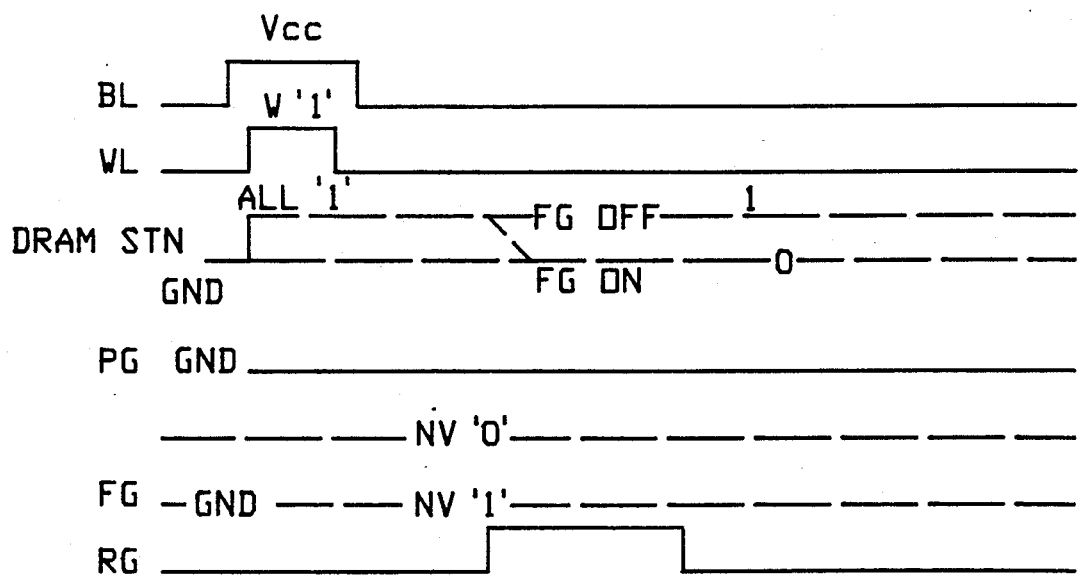
FIG. 12 is a timing diagram for a flash recall operation.

"Flash Recall", or the simultaneous transfer of all the information from the floating gate to the DRAM storage capacitor, is described in FIG. 12. First, all bit lines are elevated to a positive voltage. Next, the word line is activated and all DRAM storage capacitors are charged positively (DRAM STN). The word line is turned off, decoupling the storage capacitor from the bit line. PG is kept at the ground level. FG will be at one of two states, either it will contain electrons and the EEPROM device (transistor 25) will be at a high threshold voltage or there are no electrons and transistor 25 has a negative threshold voltage (Vt) and the device is normally on even with FG at zero volts. RG is kept at zero volts such that transistor 26 is off preventing leakage from $C_s$ to the N+buried plate which is at zero volts. RG is then activated. If transistor 25 Vt is positive, then there is no discharge path to ground since PG is at zero. If the VT is negative, there is a leakage path which discharges the capacitor $C_s$ even with PG=0 volts. After allowing time for the complete simultaneous discharge of the storage nodes $C_s$, the recall gate is shut off and the DRAM storage nodes are set at the same point they were prior to the power shutdown and normal DRAM operation can proceed until the next power shutdown.

The state of the EEPROM devices will remain undisturbed until the next power shutdown in which it is desired to save the state of the memory. The EEPROM devices could be used to store the boot conditions for the system rather than the data at the time of power system failure in those situations where the system has been intentionally shut down and data saved. Thus, this array could serve as a self booting DRAM as well as a non-volatile storage of data. In a self booting mode, the NVDRAM would save system power and increase performance during system turn on. The ability to turn the DRAM off during intervals of low DRAM usage independent of power failures will save system power during operation and preserve battery life. The ability to ensure data integrity and a density close to that of Flash memory as well as DRAM read/write performance makes it possible to combine both main memory and non-volatile store requirements in a single NVDRAM component. This gives the high performance and high cyclability of DRAM main memory, the non-volatile storage of Flash, the boot capability of a BIOS chip all at densities comparable to those of DRAM and Flash chips.

While the invention has been particularly shown and described with reference to a preferred embodiment thereof, it will be understood by those skilled in the art the various changes in form and details may be made therein without departing from the spirit and scope of the invention.

What is claimed is:

1. A semiconductor device memory array formed on a semiconductor substrate, comprising:
    a multiplicity of DRAM cells, each of said DRAM cells having a FET with a gate electrode and first and second diffusion regions, and a storage capacitor having first and second storage electrodes, said storage electrode being coupled to said first diffusion region of said FET;
    and a multiplicity of EEPROM cells, each having a floating gate disposed in a trench in said semiconductor substrate running between respective ones of said multiplicity of DRAM cells, each of said multiplicity of EEPROM cells having a first controlled electrode connected to said first diffusion region of a respective one of said FETs of a respective one of said DRAM cells, so that a logic state stored by said storage capacitor modulates a charge region in a portion of said substrate adjacent to said floating gate to control a charge stored in said floating gate.

2. A memory array according to claim 1 wherein said storage capacitor comprises a stacked capacitor.

3. A memory array according to claim 1 wherein said storage capacitor comprises a deep trench storage capacitor.

4. A semiconductor device memory array according to claim 3 wherein said multiplicity of FETs are disposed in rows and columns, and wherein said trenches run diagonally between respective ones of said multiplicity of DRAM devices.

5. A memory array according to claim 4 wherein said multiplicity of DRAM cells are in a quarter-pitched array.

6. An array according to claim 5 wherein said multiplicity of EEPROM cells comprise a pair of continuous polysilicon structures disposed within said shallow trench that function as program and recall gates and a plurality of discontinuous polysilicon structures disposed within said shallow trench that function as floating gates.

7. An array according to claim 6 wherein said polysilicon floating gates are disposed along opposite walls of said shallow trench and separated from a portion of the silicon substrate adjacent to said trench by a dielectric material such that when a negative charge resides on one of said floating gates, a vertically oriented inversion is more difficult to induce in said substrate adjacent said floating gate.

8. An array according to claim 7 wherein said continuous polysilicon program and recall gate structures are parallel and separated by a dielectric material, said recall gate being disposed along the bottom of said shallow EEPROM trench and extending below a P/N boundary in said silicon substrate.

9. An array according to claim 8 wherein said floating gate structures are separated from said program and recall gate structures by a material that permits Fowler-Nordheim tunneling.

10. An array according to claim 9 wherein said material that permits Fowler-Nordheim tunneling comprises silicon rich nitride.

11. A semiconductor device memory array according to claim 9 wherein said material that permits Fowler-Nordheim tunneling comprises silicon rich oxide.

12. A semiconductor device memory array according to claim 1 wherein a single external power supply voltage operates both said DRAM cells and said EEPROM cells.

13. A memory cell array formed relative to a surface of a semiconductor substrate, said memory cell array comprising:
(a) at least four rectangular trenches aligned in two parallel rows offset such that corresponding elements of said rectangular trenches fall on a diagonal line which is at about 45° to said parallel rows, each rectangular trench containing an electrode surrounded by an insulator;
(b) at least one elongated, linear trench oriented parallel to said diagonal line, said elongated trench having first and second side portions and a bottom portion;
(c) at least one first electrode disposed in one of said elongated trenches such that each trench contains a first electrode, each of said first electrodes being coupled to a voltage source and each of said first electrodes having a first surface portion;
(d) a plurality of second electrodes, disposed at said first side portion of one of said elongated trenches such that each second electrode is adjacent one rectangular trench on its side of said elongated trench, each of said second electrodes having a second surface portion disposed adjacent said first surface portion of a respective one of said first electrodes for receiving injected electrons therefrom, and each of said second electrodes having a third surface portion;
(e) a plurality of third electrodes disposed at said second side portion of one of said elongated trenches such that each third electrode is adjacent one rectangular trench on its side of said elongated trench, each of said third electrodes having a second surface portion disposed adjacent said first surface portion of a respective one of said first electrodes for receiving injected electrons therefrom, and each of said third electrodes having a third surface portion;
(f) a fourth electrode disposed at said upper portion of one of said elongated trenches, having a fourth surface portion disposed adjacent said third surface portions of respective ones of said second and third electrodes for receiving electrons injected therefrom; and
(g) a diffusion region, said diffusion region being adjacent to said elongated trench and disposed between adjacent ones of said rectangular trenches, said diffusion region being coupled to a signal source.

14. A memory cell array according to claim 13 further comprising a plurality of elongated, linear diagonal, substantially parallel trench segments formed in said surface of said substrate, each of said elongated trench segments connected by connecting trench segments parallel to said rows of rectangular trenches so as to form a single, continuous trench passing adjacent a plurality of said rectangular trenches in said array.

15. A memory cell array according to claim 13 wherein electrical connection between said first electrode and said first electrode voltage source and said fourth electrode and said fourth electrode voltage source is provided in said connecting trench segments.

16. A memory cell array according to claim 15 further characterized in that:
(a) said semiconductor substrate is a bilayered substrate;
(b) said elongated trench cuts through one corner of each of said rectangular trenches, and said elongated trench bottom is below a boundary between layers of said bilayered semiconductor substrate;
(c) said first electrode is disposed at said bottom portion of one of said elongated trenches;
(d) said fourth electrode is disposed at said upper portion of one of said elongated trenches and each of said fourth electrodes has a fourth surface portion disposed adjacent said third surface portions of respective ones of said second and third electrodes for receiving electrons injected therefrom; and
(e) said diffusion region is additionally coupled to said electrodes in said rectangular trenches.

17. A memory cell array according to claim 16 wherein said memory cell comprises a DRAM cell and an EEPROM cell; said first electrodes comprise recall gates, said second electrodes and said third electrodes comprise floating gates, said fourth electrodes comprise program gates, and said rectangular trench electrodes comprise DRAM capacitors.

18. An EEPROM memory array formed in a semiconductor substrate, said EEPROM array comprising:
(a) a groove formed in said substrate;
(b) a first continuous electrode coupled to a first voltage source;

(c) a second continuous electrode coupled to a second voltage source;
(d) a plurality of discontinuous electrodes;
(e) an electrically insulating material separating all of said electrodes from said substrate, said first and second electrodes from each other, and said discontinuous electrodes from one another; and
(f) a material that allows electrons to tunnel between said discontinuous electrodes and said first and second electrodes.

19. An EEPROM according to claim 18 wherein said first electrode is disposed at a bottom of said groove, said second electrode is disposed at a top of said groove and said discontinuous electrodes are disposed along two sides of said groove.

20. An EEPROM according to claim 19 wherein said first electrode functions as a recall gate, second electrode functions as a program gate, and said discontinuous electrodes function as floating 21. An EEPROM according to claim 19 wherein said groove passes through an array of individual memory cells on said substrate and electrical connections are made to said first and second continuous electrodes in a region outside said array of individual memory cells.

22. An EEPROM cell comprising a first electrode which functions as a recall gate, a second electrode which functions as a program gate, and at least two third electrodes which function as floating gates wherein said first and second electrodes are T-shaped in cross section, said first electrode is in inverted T orientation, said second electrode is in upright T orientation, the main axes of both electrodes are aligned vertically and said two third electrodes occupy regions on opposite sides of said vertically aligned first and second electrodes within a vertical region defined by horizontal elements of said T-shaped first and second electrodes.

23. A coupled DRAM-EEPROM circuit comprising:
(a) an input terminal;
(b) a control terminal;
(c) a field effect transistor (FET) having a current channel and a control electrode for receiving a signal; a first end of said channel being connected to said input terminal;
(d) a storage capacitor having an input coupled to a second end of said channel;
(e) a second FET having a control electrode for receiving a signal, a floating gate, and a current channel, a first end of said second FET current channel being coupled to said second end of said first FET channel and to said capacitor;
(f) a third FET having a control electrode for receiving a signal and a current channel, a first end of said third FET channel being coupled to a second end of said second FET channel; second end of said third FET channel being coupled to a signal node a second end of said third FET channel being coupled to said control terminal;
(g) said floating gate of said second FET being capable of receiving electrons by tunneling from said third FET control electrode; said floating gate of said second FET being capable of discharging electrons by tunneling to said second FET control electrode; and
(h) said storage capacitor having a higher capacitance than a capacitive load provided by said second and third FETs.

24. A coupled DRAM-EEPROM circuit according to claim 23 whereby when said first FET control electrode and said third FET control electrode are at ground, said storage capacitor and said second FET are isolated, allowing said second FET control electrode to modulate a transfer of electrons to said floating gate from said third FET electrode and from said floating gate to said second FET electrode as a function of a condition of said storage capacitor.

25. A coupled DRAM-EEPROM circuit according to claim 23 wherein said first FET and said storage capacitor comprise a DRAM, said second and third FETs comprise an EEPROM which can exist in one of two states and said storage capacitor controls the state of said EEPROM.

26. A coupled DRAM-EEPROM circuit according to claim 25 wherein said second FET control electrode and said third FET control electrodes are controlled independently at ground or at a single control signal voltage.

27. A coupled DRAM-EEPROM circuit according to claim 26 wherein said single control voltage is between ten and eighteen volts.

28. A coupled DRAM-EEPROM circuit according to claim 27 wherein said control voltage is supplied by an on-chip voltage device.

29. A shadow DRAM cell, comprising:
a first FET having a gate electrode coupled to a word line and first and second controlled electrodes said first controlled electrode being coupled to a bit line;
a storage capacitor having first and second electrodes, one of said electrodes of said storage capacitor being coupled to said second controlled electrode of said first FET; and
a second FET having a floating gate, a first control gate disposed on said floating gate, and first and second controlled electrodes, said first controlled electrode of said second FET being coupled to said second controlled electrode of said first FET.

30. The shadow DRAM cell according to claim 29 wherein said second FET further comprises a second control gate disposed on said floating gate.

31. The shadow DRAM cell according to claim 29 wherein said first and second control gates receive first and second control signals, respectively, to respectively inject charge into or remove charge from said floating gate as a function of a logic state stored by aid storage capacitor.

32. An EEPROM cell formed in a semiconductor substrate having a trench formed therein having a lower portion, an upper portion, and first and second sides, comprising:
a first electrode formed within the bottom portion of the trench;
a second electrode formed within the trench and abutting at least the first side of the trench and a portion of said first electrode for receiving electrons injected therefrom;
a third electrode formed at least partially within the trench, and abutting said second electrode for receiving tunneling electrons injected therefrom, and
a diffusion region extending from the surface of the substrate and abutting at least the side of the trench.

33. The EEPROM cell according to claim 32 wherein said diffusion region comprises a controlled electrode of an FET formed on a portion of said substrate abutting said trench.

34. The EEPROM cell according to claim 33 wherein said diffusion region is coupled to a storage electrode of a capacitor.

35. The EEPROM cell according to claim 32 wherein a plurality of said EEPROM cells are formed within an elongated trench, wherein said first and third electrodes comprise elongated conductors that run along the entire length of said trench, and wherein said second electrode comprises a discontinuous conductor having a plurality of respective portions separated by an insulator.

* * * * *